United States Patent
Baniecki et al.

(10) Patent No.: US 10,559,737 B2
(45) Date of Patent: Feb. 11, 2020

(54) METHOD FOR PRODUCING THERMOELECTRIC CONVERSION APPARATUS AND THERMOELECTRIC CONVERSION APPARATUS

(71) Applicant: FUJITSU LIMITED, Kawasaki-shi, Kanagawa (JP)

(72) Inventors: John David Baniecki, Zama (JP); Hiroyuki Aso, Atsugi (JP); Yoshihiko Imanaka, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 387 days.

(21) Appl. No.: 15/286,810

(22) Filed: Oct. 6, 2016

(65) Prior Publication Data

US 2017/0104144 A1 Apr. 13, 2017

(30) Foreign Application Priority Data

Oct. 13, 2015 (JP) .................. 2015-202211

(51) Int. Cl.
*H01L 35/22* (2006.01)
*H01L 35/32* (2006.01)
*H01L 35/34* (2006.01)

(52) U.S. Cl.
CPC .............. *H01L 35/22* (2013.01); *H01L 35/32* (2013.01); *H01L 35/34* (2013.01)

(58) Field of Classification Search
CPC .......... H01L 35/22; H01L 35/32; H01L 35/34
See application file for complete search history.

(56) References Cited

U.S. PATENT DOCUMENTS 7,435,896 B2 10/2008 Adachi et al.
2009/0173932 A1 7/2009 Ohta et al.
(Continued)

FOREIGN PATENT DOCUMENTS

JP 2010-93009 4/2010
WO 2004/105144 12/2004
(Continued)

OTHER PUBLICATIONS

JPOA—Office Action of Japanese patent application No. 2015-202211 dated Mar. 5, 2019 with Machine translation.
(Continued)

*Primary Examiner* — Tae-Sik Kang
(74) *Attorney, Agent, or Firm* — Fujitsu Patent Center

(57) ABSTRACT

A thermoelectric conversion element includes: a first film including a perovskite structure; a second film and a third film, including a perovskite structure, disposed in such a manner that the first film is interposed between the second film and the third film; a fourth film, including a perovskite structure, disposed so as to interpose the second film with the first film; and a fifth film, including a perovskite structure, disposed so as to interpose the third film with the first film, wherein an offset in conduction band between the first film and the second film and an offset in conduction band between the first film and the third film is less than 0.25 eV, and an offset in conduction band between the second film and the fourth film and an offset in conduction band between the third film and the fifth film is more than 1 eV.

17 Claims, 4 Drawing Sheets

(56) References Cited

U.S. PATENT DOCUMENTS

| | | | |
|---|---|---|---|
| 2012/0090657 A1* | 4/2012 | Lee | H01L 35/22 136/205 |
| 2012/0097206 A1 | 4/2012 | Sadaoka et al. | |
| 2015/0053247 A1* | 2/2015 | Baniecki | H01L 35/22 136/205 |

FOREIGN PATENT DOCUMENTS

| | | |
|---|---|---|
| WO | 2007/132782 A1 | 11/2007 |
| WO | 2013/171834 A1 | 11/2013 |

OTHER PUBLICATIONS

JPOA—Office Action of Japanese Patent Application No. 2015-202211 dated Sep. 3, 2019 with Machine Translation. *References cited in the JPOA were previously submitted in the IDS filed on May 29, 2019.

* cited by examiner

METHOD FOR PRODUCING THERMOELECTRIC CONVERSION APPARATUS AND THERMOELECTRIC CONVERSION APPARATUS

CROSS-REFERENCE TO RELATED APPLICATION

This application is based upon and claims the benefit of priority of the prior Japanese Patent Application No. 2015-202211, filed on Oct. 13, 2015, the entire contents of which are incorporated herein by reference.

FIELD

The embodiments discussed herein are related to a thermoelectric conversion element, a method for producing the thermoelectric conversion element, a thermoelectric conversion apparatus, and the like.

BACKGROUND

Attention has been focused on thermoelectric conversion elements, which are clean power generation systems, from the viewpoints of a reduction in carbon dioxide ($CO_2$) emission and environmental protection.

Japanese Laid-open Patent Publication No. 2010-93009 and International Publication Pamphlet No. WO2004105144 disclose the related art.

SUMMARY

According to an aspect of the embodiments, a thermoelectric conversion element includes: a first film including a perovskite structure; a second film and a third film, including a perovskite structure, disposed in such a manner that the first film is interposed between the second film and the third film; a fourth film, including a perovskite structure, disposed so as to interpose the second film with the first film; and a fifth film, including a perovskite structure, disposed so as to interpose the third film with the first film, wherein an offset in conduction band at an interface between the first film and the second film and an offset in conduction band at an interface between the first film and the third film is less than 0.25 eV, and an offset in conduction band at an interface between the second film and the fourth film and an offset in conduction band at an interface between the third film and the fifth film is more than 1 eV.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Use of thermoelectric conversion elements enables thermal energy, which is used to be exhausted, to be converted into electric energy and reused.

There may be room for improving, for example, the thermoelectric efficiency of thermoelectric conversion elements.

Figure 1A:
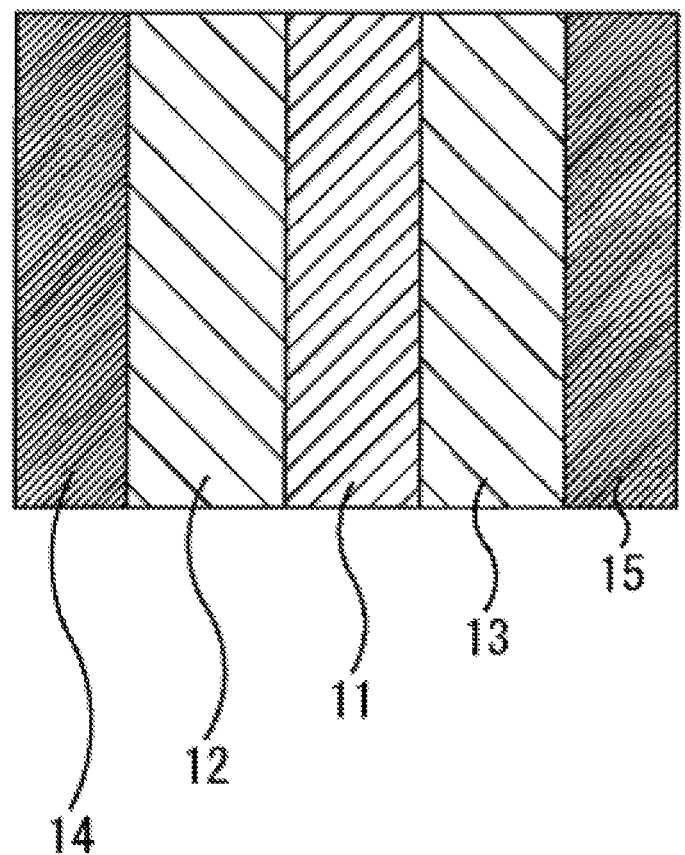
FIGS. 1A and 1B illustrate an example structure of a thermoelectric conversion element.
Figure 1B:
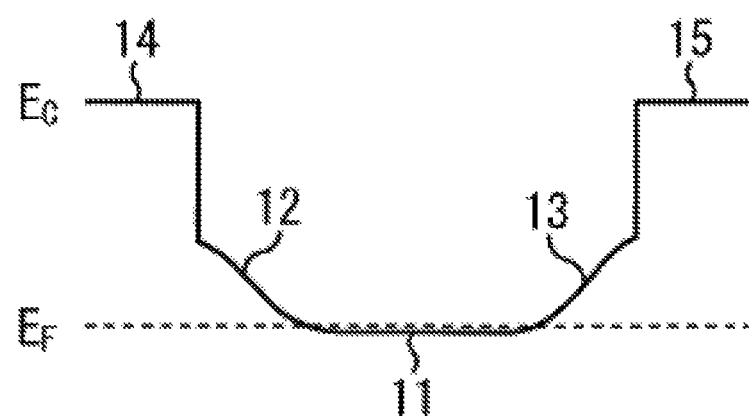

FIGS. 1A and 1B illustrate an example structure of a thermoelectric conversion element.

A thermoelectric conversion element 10 includes a $Sr_{0.95}La_{0.05}TiO_3$ film 11 and $SrTiO_3$ films 12 and 13 between which the $Sr_{0.95}La_{0.05}TiO_3$ film 11 is interposed as illustrated in FIG. 1A. The thermoelectric conversion element 10 also includes $SrZrO_3$ films 14 and 15 between which the $SrTiO_3$ film 12, the $Sr_{0.95}La_{0.05}TiO_3$ film 11, and the $SrTiO_3$ film 13 are interposed. For example, the $SrTiO_3$ film 12 is interposed between the $Sr_{0.95}La_{0.05}TiO_3$ film 11 and the $SrZrO_3$ film 14, and the $SrTiO_3$ film 13 is interposed between the $Sr_{0.95}La_{0.05}TiO_3$ film 11 and the $SrZrO_3$ film 15. The offset in conduction band at the interface between the $Sr_{0.95}La_{0.05}TiO_3$ film 11 and the $SrTiO_3$ film 12 and the offset in conduction band at the interface between the $Sr_{0.95}La_{0.05}TiO_3$ film 11 and the $SrTiO_3$ film 13 may be 0.25 eV or less. The offset in conduction band at the interface between the $SrTiO_3$ film 12 and the $SrZrO_3$ film 14 and the offset in conduction band at the interface between the $SrTiO_3$ film 13 and the $SrZrO_3$ film 15 may be 1.0 eV or more.

The thickness of the $Sr_{0.95}La_{0.05}TiO_3$ film 11 may be set to 4 to 100 Å in order to achieve sufficient quantum confinement. The thicknesses of the $SrTiO_3$ films 12 and 13 may be set to 4 to 1,000 Å in order to reduce the influence of electrons migrating from the $Sr_{0.95}La_{0.05}TiO_3$ film 11 into the $SrTiO_3$ films 12 and 13. The thicknesses of the $SrZrO_3$ films 14 and 15 may be set to 100 Å or more in order to ensure the insulating capabilities of the $SrZrO_3$ films 14 and 15. However, the insulating capabilities of the $SrZrO_3$ films 14 and 15 is saturated when the thicknesses of the $SrZrO_3$ films 14 and 15 reach about 10,000 Å, and setting the thicknesses of the $SrZrO_3$ films 14 and 15 to more than 10,000 Å vainly increases the cost. Thus, the thicknesses of the $SrZrO_3$ films 14 and 15 may be set to 10,000 Å or less.

The offset in the conduction band $E_C$ between the $Sr_{0.95}La_{0.05}TiO_3$ film 11 and the $SrTiO_3$ film 12 and the offset in the conduction band $E_C$ between the $Sr_{0.95}La_{0.05}TiO_3$ film 11 and the $SrTiO_3$ film 13 are considerably small as illustrated in FIG. 1B. This causes charge to migrate from the $Sr_{0.95}La_{0.05}TiO_3$ film 11 into the $SrTiO_3$ films 12 and 13, thereby a reduction in charge density occurring. As a result, the Seebeck coefficient may be improved.

The energy of the conduction bands of the $SrZrO_3$ film 14, the $SrTiO_3$ film 12, the $Sr_{0.95}La_{0.05}TiO_3$ film 11, the $SrTiO_3$ film 13, and the $SrZrO_3$ film 15 form a quantum well as illustrated in FIG. 1B. Therefore, due to the quantum confinement, charge migration into the $SrZrO_3$ films 14 and 15 may be reduced. For example, an excessive reduction in charge density may be reduced. Accordingly, a figure of merit (ZT), which is one of measures of thermoelectric efficiency, may be improved.

Figure 2A:
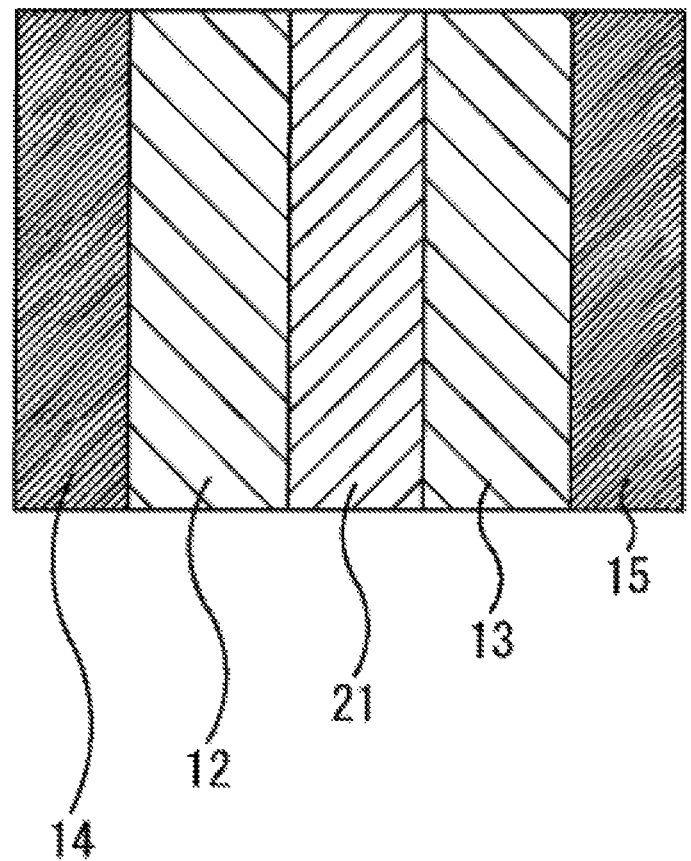
FIGS. 2A and 2B illustrate an example structure of a thermoelectric conversion element.
Figure 2B:
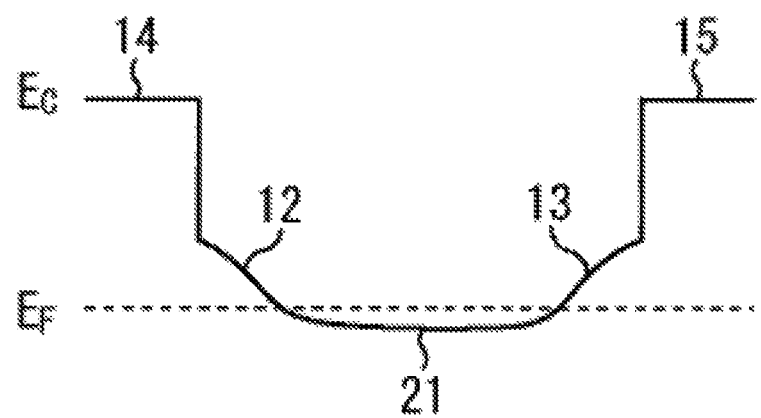

FIGS. 2A and 2B illustrate an example structure of a thermoelectric conversion element.

A thermoelectric conversion element 20 includes a $Sr_{0.90}La_{0.10}TiO_3$ film 21 instead of the $Sr_{0.95}La_{0.05}TiO_3$ film 11 as illustrated in FIG. 2A. The thermoelectric conversion element 20 also includes the $SrTiO_3$ films 12 and 13 and the SrZrO$_3$ films 14 and 15 as in the thermoelectric conversion element 10 illustrated in FIG. 1A. The offset in conduction band at the interface between the Sr$_{0.90}$La$_{0.10}$TiO$_3$ film 21 and the SrTiO$_3$ film 12 and the offset in conduction band at the interface between the Sr$_{0.90}$La$_{0.10}$TiO$_3$ film 21 and the SrTiO$_3$ film 13 may be 0.25 eV or less. The offset in conduction band at the interface between the SrTiO$_3$ film 12 and the SrZrO$_3$ film 14 and the offset in conduction band at the interface between the SrTiO$_3$ film 13 and the SrZrO$_3$ film 15 may be 1.0 eV or more. The thickness of the Sr$_{0.90}$La$_{0.10}$TiO$_3$ film 21 may be, for example, 4 to 100 Å.

The offset in the conduction band E$_C$ between the Sr$_{0.90}$La$_{0.10}$TiO$_3$ film 21 and the SrTiO$_3$ film 12 and the offset in the conduction band E$_C$ between the Sr$_{0.90}$La$_{0.10}$TiO$_3$ film 21 and the SrTiO$_3$ film 13 are considerably small as illustrated in FIG. 2B. This causes charge to migrate from the Sr$_{0.90}$La$_{0.10}$TiO$_3$ film 21 into the SrTiO$_3$ films 12 and 13, thereby a reduction in charge density occurring. As a result, the Seebeck coefficient may be improved.

The energy of the conduction bands of the SrZrO$_3$ film 14, the SrTiO$_3$ film 12, the Sr$_{0.90}$La$_{0.10}$TiO$_3$ film 21, the SrTiO$_3$ film 13, and the SrZrO$_3$ film 15 form a quantum well as illustrated in FIG. 2B. Therefore, due to the quantum confinement, charge migration into the SrZrO$_3$ films 14 and 15 may be reduced. For example, an excessive reduction in charge density may be reduced. Accordingly, a figure of merit (ZT), which is one of the measures of thermoelectric efficiency, may be improved.

Figure 3A:
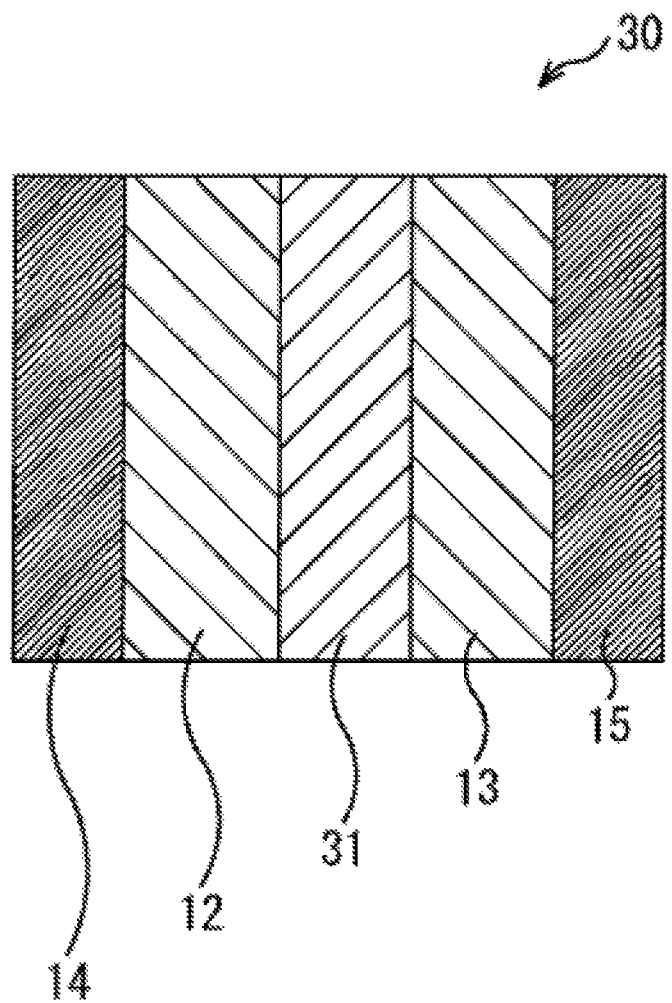
FIGS. 3A and 3B illustrate an example structure of a thermoelectric conversion element.
Figure 3B:
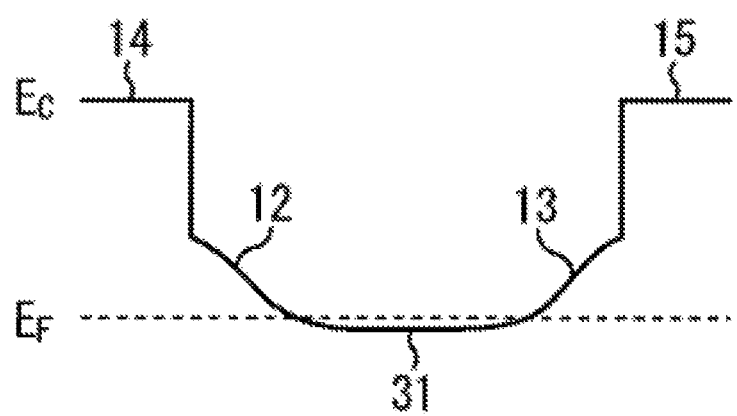

FIGS. 3A and 3B illustrate an example structure of a thermoelectric conversion element.

A thermoelectric conversion element 30 includes a Sr$_{0.95}$Nb$_{0.05}$TiO$_3$ film 31 instead of the Sr$_{0.95}$La$_{0.05}$TiO$_3$ film 11 as illustrated in FIG. 3A. The thermoelectric conversion element 30 also includes the SrTiO$_3$ films 12 and 13 and the SrZrO$_3$ films 14 and 15 as in the thermoelectric conversion element 10 illustrated in FIG. 1A. The offset in conduction band at the interface between the Sr$_{0.95}$Nb$_{0.05}$TiO$_3$ film 31 and the SrTiO$_3$ film 12 and the offset in conduction band at the interface between the Sr$_{0.95}$Nb$_{0.05}$TiO$_3$ film 31 and the SrTiO$_3$ film 13 may be 0.25 eV or less. The offset in conduction band at the interface between the SrTiO$_3$ film 12 and the SrZrO$_3$ film 14 and the offset in conduction band at the interface between the SrTiO$_3$ film 13 and the SrZrO$_3$ film 15 may be 1.0 eV or more. The thickness of the Sr$_{0.95}$Nb$_{0.05}$TiO$_3$ film 31 may be, for example, 4 to 100 Å.

The offset in the conduction band E$_C$ between the Sr$_{0.95}$Nb$_{0.05}$TiO$_3$ film 31 and the SrTiO$_3$ film 12 and the offset in the conduction band E$_C$ between the Sr$_{0.95}$Nb$_{0.05}$TiO$_3$ film 31 and the SrTiO$_3$ film 13 are considerably small as illustrated in FIG. 3B. This causes charge to migrate from the Sr$_{0.95}$Nb$_{0.05}$TiO$_3$ film 31 into the SrTiO$_3$ films 12 and 13, thereby a reduction in charge density occuring. As a result, the Seebeck coefficient may be improved.

The energy of the conduction bands of the SrZrO$_3$ film 14, the SrTiO$_3$ film 12, the Sr$_{0.95}$Nb$_{0.05}$TiO$_3$ film 31, the SrTiO$_3$ film 13, and the SrZrO$_3$ film 15 form a quantum well as illustrated in FIG. 3B. Therefore, due to the quantum confinement, charge migrating into the SrZrO$_3$ films 14 and 15 may be reduced. For example, an excessive reduction in charge density may be reduced. Accordingly, a figure of merit (ZT), which is one of the measures of thermoelectric efficiency, may be improved.

For example, the thermoelectric conversion element illustrated in FIGS. 1A and 1B is prepared, and measurement of offset in conduction band is made. The thicknesses of the SrZrO$_3$ films 14 and 15 may be, for example, 180 Å. The thicknesses of the SrTiO$_3$ films 12 and 13 may be, for example, 18 Å. The thickness of the Sr$_{0.95}$La$_{0.05}$TiO$_3$ film 11 may be as large as the thickness of one atomic layer. The SrZrO$_3$ film 14, the SrTiO$_3$ film 12, the Sr$_{0.95}$La$_{0.05}$TiO$_3$ film 11, the SrTiO$_3$ film 13, and the SrZrO$_3$ film 15 are formed on a (LaAlO$_3$)$_{0.3}$—(SrAl$_{0.5}$Ta$_{0.5}$O$_3$)$_{0.7}$ (LSAT) substrate by pulse laser deposition (PLD). As a result of the measurement, the offset in conduction band at the interface between the Sr$_{0.95}$La$_{0.05}$TiO$_3$ film 11 and the SrTiO$_3$ film 12 and the offset in conduction band at the interface between the Sr$_{0.95}$La$_{0.05}$TiO$_3$ film 11 and the SrTiO$_3$ film 13 were 0.25 eV or less. The offset in conduction band at the interface between the SrTiO$_3$ film 12 and the SrZrO$_3$ film 14 and the offset in conduction band at the interface between the SrTiO$_3$ film 13 and the SrZrO$_3$ film 15 were 1.9 eV.

For example, the thermoelectric conversion element illustrated in FIGS. 2A and 2B is prepared, and measurement of offset in conduction band is made. As a result the measurement, the offset in conduction band at the interface between the Sr$_{0.90}$La$_{0.10}$TiO$_3$ film 21 and the SrTiO$_3$ film 12 and the offset in conduction band at the interface between the Sr$_{0.90}$La$_{0.10}$TiO$_3$ film 21 and the SrTiO$_3$ film 13 were 0.25 eV or less. The offset in conduction band at the interface between the SrTiO$_3$ film 12 and the SrZrO$_3$ film 14 and the offset in conduction band at the interface between the SrTiO$_3$ film 13 and the SrZrO$_3$ film 15 were 1.9 eV.

For example, the thermoelectric conversion element illustrated in FIGS. 3A and 3B is prepared, and measurement of offset in conduction band is made. As a result of the measurement, the offset in conduction band at the interface between the Sr$_{0.95}$Nb$_{0.05}$TiO$_3$ film 31 and the SrTiO$_3$ film 12 and the offset in conduction band at the interface between the Sr$_{0.95}$Nb$_{0.05}$TiO$_3$ film 31 and the SrTiO$_3$ film 13 were 0.25 eV or less. The offset in conduction band at the interface between the SrTiO$_3$ film 12 and the SrZrO$_3$ film 14 and the offset in conduction band at the interface between the SrTiO$_3$ film 13 and the SrZrO$_3$ film 15 were 1.9 eV.

The Sr$_{0.95}$La$_{0.05}$TiO$_3$ film 11, the SrTiO$_3$ films 12 and 13, and the SrZrO$_3$ films 14 and 15 may be formed by RF magnetron sputtering or the like. The Sr$_{0.90}$La$_{0.10}$TiO$_3$ film 21 and the Sr$_{0.95}$Nb$_{0.05}$TiO$_3$ film 31 may be formed by RF magnetron sputtering or the like.

Figure 4:
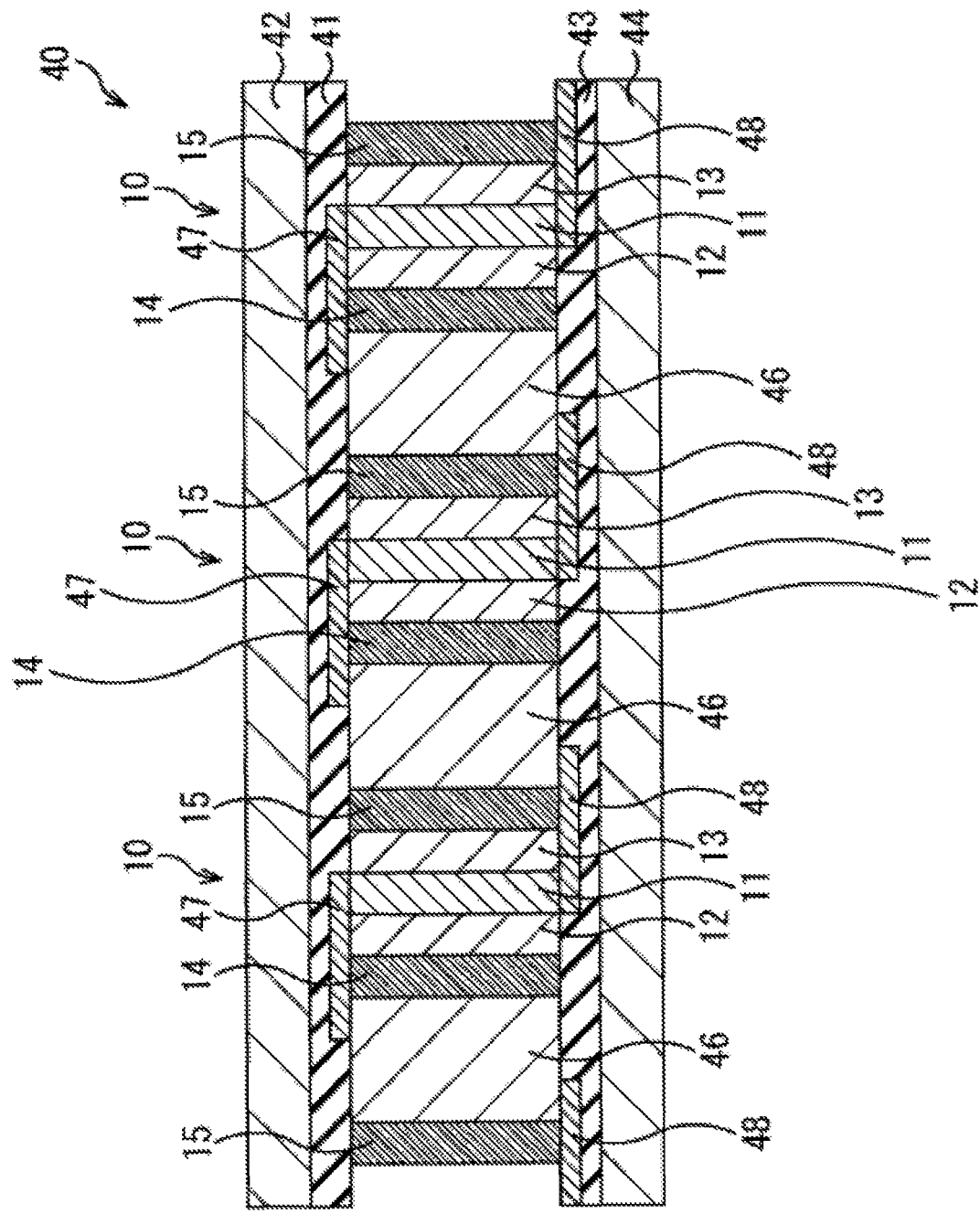
FIG. 4 is a cross-sectional view of an example structure of a thermoelectric conversion apparatus.

FIG. 4 is a cross-sectional view of an example structure of a thermoelectric conversion apparatus.

For example, a thermoelectric conversion apparatus 40 illustrated in FIG. 4 includes three thermoelectric conversion elements 10. The thermoelectric conversion apparatus 40 also includes p-type films 46 which are disposed so as to interpose the corresponding one of the SrZrO$_3$ films with the corresponding one of the SrTiO$_3$ films 12. The thermoelectric conversion apparatus 40 also includes a plurality of conductive films 47 and a plurality of conductive films 48 with which Sr$_{0.95}$La$_{0.05}$TiO$_3$ films 11 and the p-type films 46 are electrically coupled to each other in series. The conductive films 47 couple the respective Sr$_{0.95}$La$_{0.05}$TiO$_3$ films 11 to the respective p-type films 46 disposed on a side of the SrZrO$_3$ film 14 in each thermoelectric conversion element 10. The conductive films 48 couple the respective Sr$_{0.95}$La$_{0.05}$TiO$_3$ films 11 to the respective p-type films 46 disposed on a side of the SrZrO$_3$ film 15 in each thermoelectric conversion element 10. The conductive films 47 and the conductive films 48 are disposed opposite to each other across the thermoelectric conversion elements 10. In FIG. 4, the conductive films 47 are disposed in the upper portions of the thermoelectric conversion elements 10, and the conductive films 48 are disposed in the lower portions of the thermoelectric conversion elements 10. The thermoelectric conversion apparatus 40 further includes a heat sink 42 disposed on a side of the conductive films 47 are disposed and a heat sink 44 disposed on a side of the conductive films 48 are disposed. A protective film 41 is interposed between the heat sink 42 and the conductive films 47. A protective film 43 is interposed between the heat sink 44 and the conductive films 48.

The thermoelectric conversion apparatus 40 enables a figure of merit (ZT), which is one of the measures of thermoelectric efficiency, to be improved similarly to the thermoelectric conversion element illustrated in FIGS. 1A and 1B. Thus, the thermoelectric conversion apparatus 40 may have a high thermoelectric efficiency. The thermoelectric conversion apparatus 40 may include the thermoelectric conversion element 20 or 30 instead of the thermoelectric conversion element 10.

The composition of the material of the first film is not limited to $Sr_{0.95}La_{0.05}TiO_3$, $Sr_{0.90}La_{0.10}TiO_3$, or $Sr_{0.95}Nb_{0.05}TiO_3$ and, for example, $A_{1-a}M_aB_{1-b}N_bO_3$, where $0.01 \leq a \leq 0.9$ and $0.01 \leq b \leq 0.9$ may be used. The composition of the material of the second and third films is not limited to $SrTiO_3$ and, for example, $A_cB_dO_3$ may be used. In order to form a perovskite phase, $0.5 < c/d < 1.5$ is preferably satisfied. The composition of the material of the fourth and fifth films is not limited to $SrZrO_3$ and, for example, $AZr_{1-e}B_eO_3$ may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A thermoelectric conversion apparatus comprising:
a thermoelectric conversion element;
p-type thermoelectric conversion elements each provided at respective first sides of the thermoelectric conversion element in a first direction;
two protective films each disposed at respective second sides of the thermoelectric conversion element and the p-type thermoelectric conversion elements in a second direction perpendicular to the first direction; and
two heat sinks each disposed adjacent to each of the two protective films in the second direction,
wherein the thermoelectric conversion element includes:
a first film including a perovskite structure;
a second film and a third film, including a perovskite structure, disposed in such a manner that the first film is interposed between the second film and the third film and the second film and the third film are in contact with the first film;
a fourth film, including a perovskite structure, disposed adjacent to the second film and in a side opposite to the first film and being contact with the second film; and
a fifth film, including a perovskite structure, disposed adjacent to the third film and in a side opposite to the first film and being contact with the third film,
wherein each of an offset in conduction band at an interface between the first film and the second film and an offset in conduction band at an interface between the first film and the third film is less than 0.25 eV, and each of an offset in conduction band at an interface between the second film and the fourth film and an offset in conduction band at an interface between the third film and the fifth film is more than 1 eV,
wherein a first conductive film is disposed in one of the two protective films in such a manner that the first conductive film couples the first film and one of the p-type thermoelectric conversion elements and a second conductive film is disposed in the other of the two protective films in such a manner that the second conductive film couples the first film and another of the p-type thermoelectric conversion elements.

2. The thermoelectric conversion element according to claim 1, wherein the first film includes a material having a first composition of $A_{1-a}M_aB_{1-b}N_bO_3$, where $0.01 \leq a \leq 0.9$ and $0.01 \leq b \leq 0.9$.

3. The thermoelectric conversion element according to claim 2, wherein the element A contained in the first composition is Sr.

4. The thermoelectric conversion element according to claim 2, wherein the element B contained in the first composition is Ti.

5. The thermoelectric conversion element according to claim 2, wherein the element M contained in the first composition is La.

6. The thermoelectric conversion element according to claim 2, wherein the element N contained in the first composition is Nb.

7. The thermoelectric conversion element according to claim 1, wherein the first film has a thickness of 4 to 100 Å.

8. The thermoelectric conversion element according to claim 1, wherein the second film and the third film each include a material having a second composition of $A_cB_dO_3$.

9. The thermoelectric conversion element according to claim 8, wherein the element A contained in the second composition is Sr.

10. The thermoelectric conversion element according to claim 8, wherein the element B contained in the second composition is Ti.

11. The thermoelectric conversion element according to claim 8, wherein the following relationship is satisfied in the second composition: $0.5 < c/d < 1.5$.

12. The thermoelectric conversion element according to claim 1, wherein the second film and the third film have a thickness of 4 to 10,000 Å.

13. The thermoelectric conversion element according to claim 1, wherein the fourth film and the fifth film each include a material having a third composition of $AZr_{1-e}B_eO_3$.

14. The thermoelectric conversion element according to claim 13, wherein the element A contained in the third composition is Sr.

15. The thermoelectric conversion element according to claim 13, wherein the element B contained in the third composition is Ti.

16. The thermoelectric conversion element according to claim 1, wherein the third film has a thickness of 4 to 10,000 Å.

17. A method for producing a thermoelectric conversion apparatus, the method comprising:
forming a thermoelectric conversion element by:
forming a first film including a perovskite structure;
forming a second film and a third film that includes a perovskite structure and are disposed in such a manner that the first film is interposed between the second film and the third film and the second film and the third film are in contact with the first film;

forming a fourth film including a perovskite structure and disposed adjacent to the second film and in a side opposite to the first film and being contact with the second film; and forming a fifth film including a perovskite structure and disposed adjacent to the third film and in a side opposite to the first film and being contact with the third film, wherein each of an offset in conduction band at an interface between the first film and the second film and an offset in conduction band at an interface between the first film and the third film is less than 0.25 eV, and each of an offset in conduction band at an interface between the second film and the fourth film and an offset in conduction band at an interface between the third film and the fifth film is more than 1 eV;

forming p-type thermoelectric conversion elements each at respective first sides of the thermoelectric conversion element in a first direction;

forming two protective films each at respective second sides of the thermoelectric conversion element and the p-type thermoelectric conversion elements in a second direction perpendicular to the first direction; and forming two heat sinks each adjacent to each of the two protective films in the second direction, wherein a first conductive film is disposed in one of the two protective films in such a manner that the first conductive film couples the first film and one of the p-type thermoelectric conversion elements and a second conductive film is disposed in the other of the two protective films in such a manner that the second conductive film couples the first film and another of the p-type thermoelectric conversion elements.

* * * * *